(12) United States Patent
Masuda

(10) Patent No.: US 9,893,177 B2
(45) Date of Patent: Feb. 13, 2018

(54) SILICON CARBIDE SEMICONDUCTOR DEVICE AND METHOD OF MANUFACTURING THE SAME

(71) Applicant: Sumitomo Electric Industries, Ltd., Osaka-shi (JP)

(72) Inventor: Takeyoshi Masuda, Osaka (JP)

(73) Assignee: SUMITOMO ELECTRIC INDUSTRIES, LTD., Osaka-shi (JP)

( * ) Notice: Subject to any disclaimer, the term of this patent is extended or adjusted under 35 U.S.C. 154(b) by 0 days.

(21) Appl. No.: 15/026,370

(22) PCT Filed: Aug. 13, 2014

(86) PCT No.: PCT/JP2014/071360
§ 371 (c)(1),
(2) Date: Mar. 31, 2016

(87) PCT Pub. No.: WO2015/049925
PCT Pub. Date: Apr. 9, 2015

(65) Prior Publication Data
US 2016/0240656 A1    Aug. 18, 2016

(30) Foreign Application Priority Data
Oct. 1, 2013   (JP) .................................. 2013-206600

(51) Int. Cl.
*H01L 29/15* (2006.01)
*H01L 31/0312* (2006.01)
(Continued)

(52) U.S. Cl.
CPC ........ *H01L 29/7813* (2013.01); *H01L 21/049* (2013.01); *H01L 21/3065* (2013.01);
(Continued)

(58) Field of Classification Search
CPC ......... H01L 29/78; H01L 21/04; H01L 29/66; H01L 29/16; H01L 29/423
See application file for complete search history.

(56) References Cited

U.S. PATENT DOCUMENTS

| 5,714,781 A | 2/1998 | Yamamoto et al. |
| 2006/0231841 A1* | 10/2006 | Okuno ............ H01L 21/823487 257/66 |

(Continued)

FOREIGN PATENT DOCUMENTS

| JP | H08-306914 A | 11/1996 |
| JP | 2007-048769 A | 2/2007 |

(Continued)

OTHER PUBLICATIONS

International Search Report in PCT International Application No. PCT/JP2014/071360, dated Nov. 4, 2014.

*Primary Examiner* — Charles Garber
*Assistant Examiner* — Abdulfattah Mustapha
(74) *Attorney, Agent, or Firm* — Venable LLP; Michael A. Sartori; Miguel A. Lopez

(57) ABSTRACT

A silicon carbide semiconductor device includes a silicon carbide semiconductor layer having a main surface, the main surface of the silicon carbide semiconductor layer being provided with a trench having a closed shape when seen in plan view, the trench including a bottom, a plurality of sidewalls continuous with the bottom, and a sidewall-connecting corner portion at a connection portion between two adjacent sidewalls of the plurality of sidewalls, the silicon carbide semiconductor device further including a gate insulating film covering the bottom and the sidewalls of the trench, and a gate electrode provided on the gate insulating film, between the bottom and an upper end of the trench, the thickness of the gate insulating film at the sidewall-connecting corner portion of the trench being greater than the (Continued)

thickness of the gate insulating film at a portion other than the sidewall-connecting corner portion.

11 Claims, 9 Drawing Sheets

(51) Int. Cl.
    H01L 29/78      (2006.01)
    H01L 21/3065    (2006.01)
    H01L 21/308     (2006.01)
    H01L 29/16      (2006.01)
    H01L 21/04      (2006.01)
    H01L 29/423     (2006.01)
    H01L 29/66      (2006.01)
    H01L 29/06      (2006.01)

(52) U.S. Cl.
    CPC ...... *H01L 21/3083* (2013.01); *H01L 29/0696* (2013.01); *H01L 29/1608* (2013.01); *H01L 29/4236* (2013.01); *H01L 29/42368* (2013.01); *H01L 29/66068* (2013.01)

(56) References Cited

U.S. PATENT DOCUMENTS

| | | | |
|---|---|---|---|
| 2011/0121316 A1* | 5/2011 | Harada | H01L 29/41741 |
| | | | 257/77 |
| 2011/0297963 A1* | 12/2011 | Honaga | H01L 21/049 |
| | | | 257/77 |
| 2013/0112996 A1 | 5/2013 | Masuda | |
| 2013/0168701 A1* | 7/2013 | Kiyosawa | H01L 21/0475 |
| | | | 257/77 |
| 2013/0306982 A1 | 11/2013 | Kudou | |

FOREIGN PATENT DOCUMENTS

| | | |
|---|---|---|
| JP | 2012-004360 A | 1/2012 |
| JP | 2012-039133 A | 2/2012 |
| JP | 2012-191212 A | 10/2012 |
| JP | 2012-216675 A | 11/2012 |
| JP | 2012-248859 A | 12/2012 |
| WO | WO-2012/017798 A1 | 2/2012 |
| WO | WO-2012/127821 A1 | 9/2012 |

* cited by examiner

SILICON CARBIDE SEMICONDUCTOR DEVICE AND METHOD OF MANUFACTURING THE SAME

TECHNICAL FIELD

The present invention relates to silicon carbide semiconductor devices.

BACKGROUND ART

As compared to a silicon semiconductor device currently mainly used, a silicon carbide semiconductor device has many advantages such as small power loss and operability under a high temperature, and is expected as a next-generation power semiconductor device. Conventionally, various structures have been proposed for structures of semiconductor devices. For example, in a trench gate structure, a groove called "trench" is provided in a semiconductor substrate (for example, see Japanese Patent Laying-Open No. 8-306914 (PTD 1)).

CITATION LIST

Patent Document

PTD 1: Japanese Patent Laying-Open No. 8-306914

SUMMARY OF INVENTION

Technical Problem

A structure in which a gate electrode is provided within a trench with a gate insulating film interposed therebetween is suitable for reducing on-resistance, and is a promising high-speed switching device. In this structure, however, the thickness of the gate insulating film tends to decrease at a bottom surface portion of the trench. This has resulted in problems such as inability to realize a sufficient switching speed and low breakdown voltage.

In order to address such a problem, in PTD 1, the thickness of a gate oxide film at a bottom surface of a trench is increased in a silicon semiconductor device having a trench in a substrate surface, so as to improve the switching speed and increase the breakdown voltage. In a silicon carbide semiconductor device, however, an electric field stronger than in a silicon semiconductor device is applied to a gate insulating film due to a high relative dielectric constant of silicon carbide. Thus, under present circumstances, a silicon carbide semiconductor device has not been able to obtain a sufficient breakdown voltage even if the thickness of a gate insulating film at a bottom surface of a trench is increased.

In view of the aforementioned problem, it is an object to provide a silicon carbide semiconductor device having a high breakdown voltage.

Solution to Problem

A silicon carbide semiconductor device according to one embodiment of the present invention includes a silicon carbide semiconductor layer having a main surface. The main surface of the silicon carbide semiconductor layer is provided with a trench having a closed shape when seen in plan view. The trench includes a bottom, a plurality of sidewalls continuous with the bottom, and a sidewall-connecting corner portion at a connection portion between two adjacent sidewalls of the plurality of sidewalls. The silicon carbide semiconductor device further includes a gate insulating film covering the bottom and the sidewalls of the trench, and a gate electrode provided on the gate insulating film. The thickness of the gate insulating film at the sidewall-connecting corner portion of the trench is greater than the thickness of the gate insulating film at a portion other than the sidewall-connecting corner portion.

Advantageous Effects of Invention

According to above, a silicon carbide semiconductor device having a high breakdown voltage can be provided.

DESCRIPTION OF EMBODIMENTS

Figure 1:
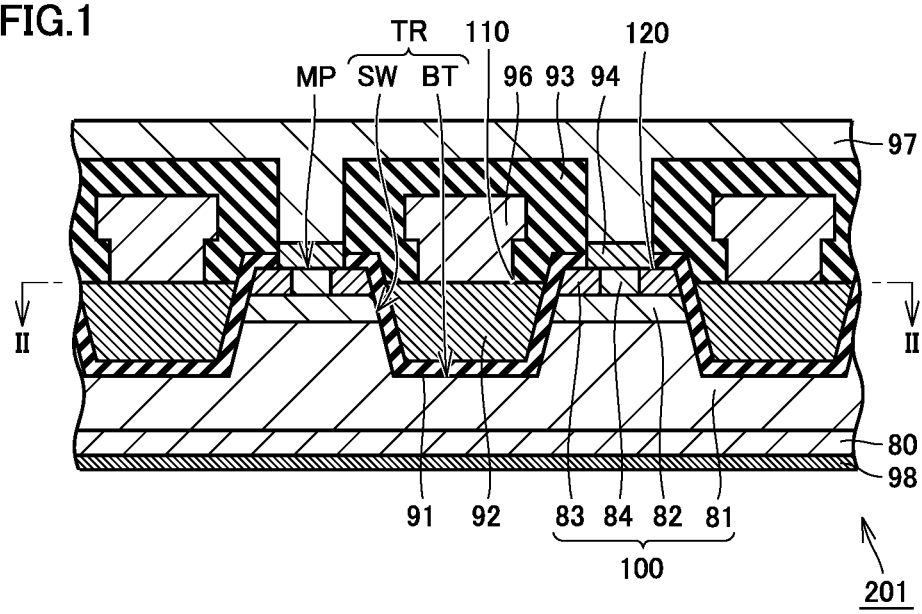
FIG. 1 is a diagram schematically showing an exemplary configuration of a silicon carbide semiconductor device according to one embodiment of the present invention.

One embodiment according to the present invention is described below in more detail. In the following drawings, the same or corresponding parts are designated by the same reference signs and are not described repeatedly. Regarding crystallographic indications in the present specification, an individual orientation is represented by [ ], a group orientation is represented by < >, an individual plane is represented by ( ), and a group plane is represented by { }. In addition, a negative crystallographic index is normally expressed by putting "-" (bar) above a numeral, but is expressed by putting a negative sign before the numeral in the present specification.

DESCRIPTION OF EMBODIMENT OF THE INVENTION OF THE PRESENT APPLICATION

First, an outline of the embodiment of the invention of the present application (hereinafter also referred to as "the present embodiment") will be listed and described in (1) to (11) below.

The present inventor conducted a diligent study to solve the aforementioned problem, and found that, in a mesa structure formed of sidewalls of a trench (groove) that are continuous with one another, when forming a gate insulating film by thermal oxidation, silicon oxide ($SiO_2$) to become the gate insulating film tends to soften and flow due to high temperature at a portion (ridge line portion) where the sidewalls are connected to each other, resulting in the gate insulating film being formed to be thin at this ridge line portion. Based on this finding, research was further conducted to complete the present embodiment. That is, a silicon carbide semiconductor device according to the present embodiment includes the following configuration.

(1) A silicon carbide semiconductor device 201 of the present embodiment includes a silicon carbide semiconductor layer 100 having a main surface MP. Here, main surface MP of silicon carbide semiconductor layer 100 is provided with a trench TR having a closed shape when seen in plan view, and trench TR includes a bottom BT, a plurality of sidewalls SW continuous with bottom BT, and a sidewall-connecting corner portion CN1 at a connection portion between two adjacent sidewalls SW of the plurality of sidewalls SW. Silicon carbide semiconductor device 201 further includes a gate insulating film 91 covering bottom BT and sidewalls SW of trench TR, and a gate electrode 92 provided on gate insulating film 91. Between bottom BT and an upper end of trench TR, the thickness of gate insulating film 91 at sidewall-connecting corner portion CN1 of trench TR is greater than the thickness of gate insulating film 91 at a portion other than sidewall-connecting corner portion CN1.

According to silicon carbide semiconductor device 201 having the configuration described above, trench TR has a closed shape when seen in plan view. That is, in trench TR, the connection portion between two adjacent sidewalls SW is a valley line instead of a ridge line. This valley line portion corresponds to sidewall-connecting corner portion CN1 in a plane intersecting with sidewalls SW in a direction along main surface MP (that is, a cross section parallel to main surface MP). Thus, even if $SiO_2$ softens and flows due to high temperature during thermal oxidation, $SiO_2$ moves to collect at sidewall-connecting corner portion CN1, thus allowing the thickness of gate insulating film 91 at sidewall-connecting corner portion CN1 to be greater than the thickness of the other portion of gate insulating film 91. Accordingly, a locally thin portion of gate insulating film 91 is not generated in the same plane, thereby exhibiting a high breakdown voltage.

(2) Preferably, an upper end of gate electrode 92 is located below the upper end of trench TR. As described above, in trench TR having a closed shape when seen in plan view, a portion of gate insulating film 91 covering a connection portion between main surface MP and sidewall SW (upper end corner portion CN2 to be described later) tends to be thinner than the other portion of gate insulating film 91. This is because this portion corresponds to a ridge line in cross section perpendicular to main surface MP. Thus, by providing gate electrode 92 such that gate electrode 92 is not in contact with this portion, a further increased breakdown voltage can be provided.

(3) Gate insulating film 91 extends to cover upper end corner portion CN2 which is a connection portion between the upper end of trench TR and main surface MP, and the thickness of a portion of gate insulating film 91 in contact with upper end corner portion CN2 is smaller than the thickness of gate insulating film 91 at the center in a depth direction of trench TR. Accordingly, the thickness of a portion of gate insulating film 91 particularly contributing to the breakdown voltage can be increased, thereby efficiently improving the breakdown voltage.

(4) Preferably, the closed shape when seen in plan view of trench TR is a hexagonal shape or quadrangular shape. By employing such a shape, the thickness of sidewall-connecting corner portion CN1 can be further increased, thereby improving the breakdown voltage.

(5) Preferably, silicon carbide semiconductor device 201 includes a gate wire 96 electrically connected to gate electrode 92, an interlayer insulating film 93 covering gate wire 96, a source region (n+ layer 83) formed in a position adjacent to trench TR in silicon carbide semiconductor layer 100, and a source wire 97 provided on interlayer insulating film 93 and electrically connected to the source region. Accordingly, in the structure where gate electrode 92 is provided in trench TR having a closed shape when seen in plan view, gate wire 96 and source wire 97 can be disposed such that they are not in contact with each other.

(6) Silicon carbide semiconductor device 201 according to the present embodiment can be manufactured with the following manufacturing method. That is, a method of manufacturing a silicon carbide semiconductor device according to the present embodiment includes a step S1 of preparing a silicon carbide semiconductor layer 100 having a main surface MP, and a step S2 of forming a trench TR having a closed shape when seen in plan view in main surface MP of silicon carbide semiconductor layer 100, trench TR including a bottom BT, a plurality of sidewalls SW continuous with bottom BT, and a sidewall-connecting corner portion CN1 at a connection portion between two adjacent sidewalls SW of the plurality of sidewalls SW, the method further including a step S3 of forming a gate insulating film 91 covering bottom BT and sidewalls SW of trench TR, and a step S4 of forming a gate electrode 92 on gate insulating film 91.

In the method of manufacturing a silicon carbide semiconductor device, between bottom BT and an upper end of trench TR, the thickness of gate insulating film 91 at sidewall-connecting corner portion CN1 of trench TR is formed to be greater than the thickness of gate insulating film 91 at a portion other than sidewall-connecting corner portion CN1.

According to the manufacturing method including the above-described steps, silicon carbide semiconductor device 201 having a high breakdown voltage can be manufactured.

(7) Preferably, in the method of manufacturing a silicon carbide semiconductor device of the present embodiment, an upper end of gate electrode 92 is formed to be located below the upper end of trench TR. Accordingly, gate electrode 92 can be provided such that gate electrode 92 is not in contact with upper end corner portion CN2, thereby manufacturing the silicon carbide semiconductor device having a further increased breakdown voltage.

(8) Preferably, in the method of manufacturing a silicon carbide semiconductor device of the present embodiment, gate insulating film 91 extends to cover an upper end corner portion CN2 which is a connection portion between the upper end of trench TR and main surface MP, and the thickness of a portion of gate insulating film 91 in contact with upper end corner portion CN2 is formed to be smaller than the thickness of gate insulating film 91 at the center in a depth direction of trench TR. Accordingly, the thickness of a portion of gate insulating film 91 particularly contributing to the breakdown voltage can be increased, thereby manufacturing the silicon carbide semiconductor device having an efficiently improved breakdown voltage.

(9) Preferably, in the method of manufacturing a silicon carbide semiconductor device of the present embodiment, the closed shape when seen in plan view of trench TR is formed as a hexagonal shape or quadrangular shape. By employing such a shape, the thickness of sidewall-connecting corner portion CN1 can be further increased, thereby manufacturing the silicon carbide semiconductor device having an improved breakdown voltage.

(10) Preferably, the method of manufacturing a silicon carbide semiconductor device of the present embodiment includes a step S5 of forming a gate wire 96 electrically connected to gate electrode 92, and a step S6 of forming an interlayer insulating film 93 covering gate wire 96, silicon carbide semiconductor layer 100 has a source region formed in a position adjacent to trench TR, and the method includes a step S7 of forming a source wire 97 provided on interlayer insulating film 93 and electrically connected to the source region.

Accordingly, the silicon carbide semiconductor device can be manufactured in which gate wire 96 and source wire 97 are disposed such that they are not in contact with each other in the structure where gate electrode 92 is provided in trench TR having a closed shape when seen in plan view.

(11) Preferably, in step S3 of forming a gate insulating film 91, gate insulating film 91 is formed by subjecting silicon carbide semiconductor layer 100 to heat treatment at a temperature of not less than 1250° C. in an atmosphere including oxygen. Accordingly, plane orientation dependence of oxidation rate can be reduced during the formation of gate insulating film 91 by thermal oxidation, enabling stable formation of gate insulating film 91 having a desired thickness. Although thermal oxidation performed at such high temperature has conventionally caused softening and flowing of $SiO_2$ which results in a lower breakdown voltage, $SiO_2$ flows to collect at sidewall-connecting corner portion CN1 in the present embodiment, thus not causing the generation of a portion that leads to a lower breakdown voltage.

DETAILS OF EMBODIMENT OF THE INVENTION OF THE PRESENT APPLICATION

The silicon carbide semiconductor device according to the present embodiment is described below in more detail, however, the embodiment of the present invention is not limited thereto.

<Silicon Carbide Semiconductor Device>

FIG. 1 is a cross-sectional view schematically showing the configuration of a silicon carbide semiconductor device 201 according to the present embodiment. Silicon carbide semiconductor device 201 shown in FIG. 1 is configured as a trench gate type MOSFET (Metal Oxide Semiconductor Field Effect Transistor). Silicon carbide semiconductor device 201 has a single-crystal substrate 80, a silicon carbide semiconductor layer 100, a gate insulating film 91, a gate electrode 92, an interlayer insulating film 93, a source electrode 94, a gate wire 96, a source wire 97, and a drain electrode 98. Single-crystal substrate 80 is made of silicon carbide and has n type conductivity. Silicon carbide semiconductor layer 100 is provided on single-crystal substrate 80.

Silicon carbide semiconductor layer 100 is a silicon carbide layer epitaxially grown on single-crystal substrate 80. Silicon carbide semiconductor layer 100 has a hexagonal crystal structure having a polytype of 4H. By employing such a crystal structure, the on-resistance of silicon carbide semiconductor device 201 can be low. Silicon carbide semiconductor layer 100 has an n drift layer 81, a p body layer 82, an n+ layer 83, and a p contact region 84.

N drift layer 81 is formed on a main surface of single-crystal substrate 80 and has n type conductivity. N drift layer 81 preferably has an impurity concentration lower than that of single-crystal substrate 80. Here, n drift layer 81 preferably has an impurity concentration of not less than $1 \times 10^{15}$ $cm^{-3}$ and not more than $5 \times 10^{16}$ $cm^{-3}$.

P body layer 82 is provided on n drift layer 81 and has p type conductivity. P body layer 82 preferably has an impurity concentration of not less than $5 \times 10^{15}$ $cm^{-3}$ and not more than $2 \times 10^{18}$ $cm^{-3}$, such as about $1 \times 10^{18}$ $cm^{-3}$.

N+ layer 83 functions as a source region and has n type conductivity. N+ layer 83 is provided on p body layer 82 such that n+ layer 83 is separated from n drift layer 81 by p body layer 82. N+ layer 83 forms, together with p contact region 84, a portion of a main surface MP of silicon carbide semiconductor layer 100.

Figure 3:
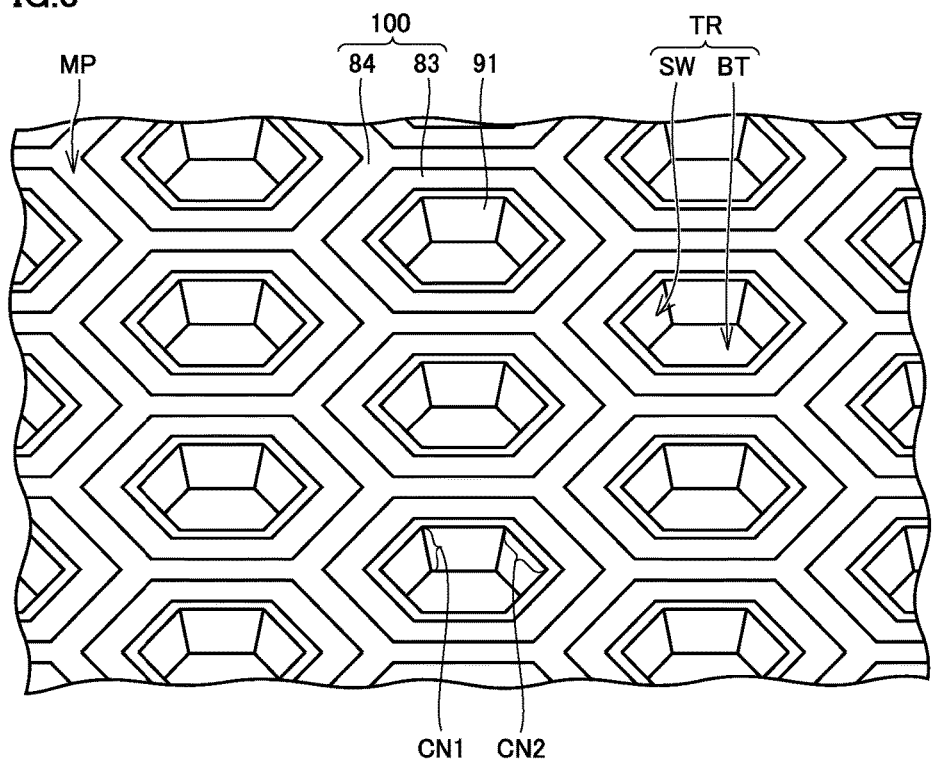
FIG. 3 is a partial perspective view schematically showing an exemplary shape of a silicon carbide semiconductor layer included in the silicon carbide semiconductor device in FIG. 1.

Main surface MP of silicon carbide semiconductor layer 100 is provided with a trench TR having a closed shape when seen in plan view. FIG. 3 is a partial perspective view schematically showing the shape of silicon carbide semiconductor layer 100. As shown in FIG. 3, in the present embodiment, trench TR having a hexagonal shape when seen in plan view is formed in main surface MP. Trench TR has a bottom BT and a plurality of sidewalls SW continuous with bottom BT. Each sidewall SW of trench TR is formed as an inclined surface which is inclined with respect to main surface MP, and the size of a cross-sectional shape of trench TR in cross section parallel to main surface MP decreases analogously toward bottom BT of trench TR. In addition, although not shown in FIG. 3, n drift layer 81, p body layer 82 and n+ layer 83 are exhibited at sidewalls SW, and n drift layer 81 is exhibited at bottom BT. Further, an inner wall of trench TR (sidewalls SW and bottom BT) is covered with gate insulating film 91. Trench TR includes a sidewall-connecting corner portion CN1 at a connection portion (valley line portion) between two adjacent sidewalls SW. Trench TR also includes an upper end corner portion CN2 at a connection portion (ridge line portion) between sidewall SW and main surface MP.

Figure 4:
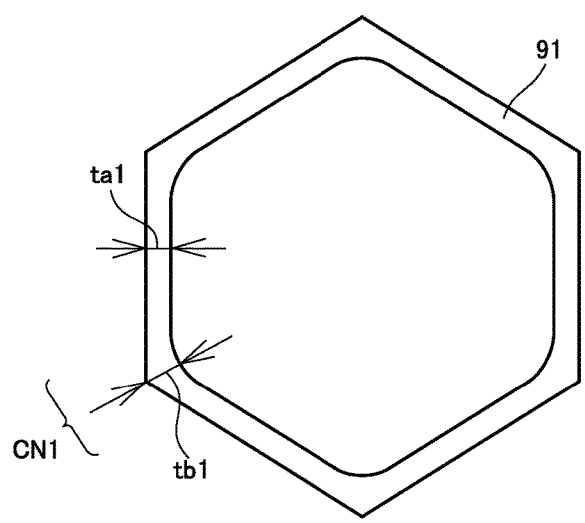
FIG. 4 is a diagram showing an exemplary planar shape of a gate insulating film according to the one embodiment of the present invention.

FIG. 4 is a partial enlarged view of gate insulating film 91 in a plane intersecting with sidewalls SW in a direction along main surface MP, between bottom BT and an upper end of trench TR. As shown in FIG. 4, in the present embodiment, sidewall-connecting corner portion CN1 is formed to project toward silicon carbide semiconductor layer 100. Thus, the thickness of gate insulating film 91 at sidewall-connecting corner portion CN1 is greater than the thickness of gate insulating film 91 at a portion other than sidewall-connecting corner portion CN1. That is, there is no locally thin portion of gate insulating film 91 in the same plane. Moreover, the thickness of gate insulating film 91 can be rather increased at sidewall-connecting corner portion CN1, where gate insulating film 91 has conventionally tended to be thin. Accordingly, silicon carbide semiconductor device 201 can have a high breakdown voltage.

Figure 5:
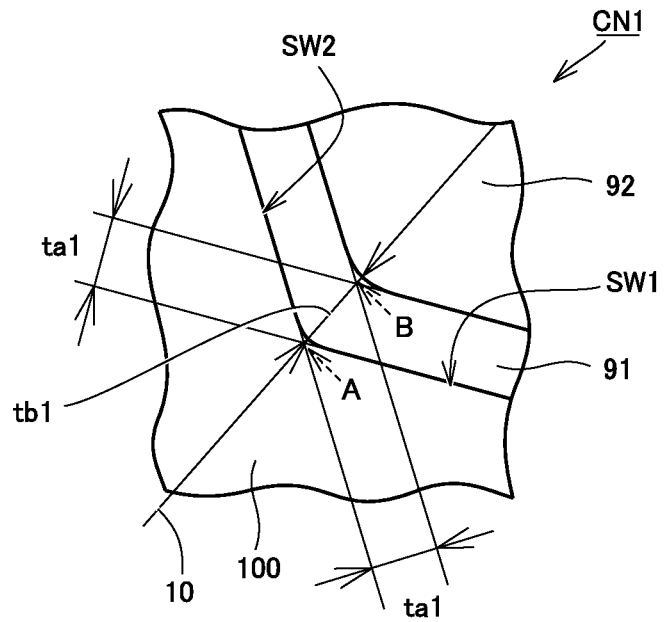
FIG. 5 is a partial enlarged view showing a vicinity of a sidewall-connecting corner portion according to the one embodiment of the present invention.

It should be noted that "the thickness of gate insulating film 91 at sidewall-connecting corner portion CN1" is defined as follows in the present embodiment. FIG. 5 is a partial enlarged view of a vicinity of sidewall-connecting corner portion CN1 in cross section parallel to main surface MP. In FIG. 5, sidewall-connecting corner portion CN1 is formed at a connection portion between two adjacent sidewall SW1 and sidewall SW2. As shown in FIG. 5, gate insulating film 91 has a thickness ta1 at a linearly extending portion thereof. Then, consider two straight lines which are parallel to sidewall SW1 and which sandwich gate insulating film 91 therebetween, and two straight lines which are parallel to sidewall SW2 and which sandwich gate insulating film 91 therebetween. A thickness tb1 of gate insulating film 91 on a straight line 10 passing through an intersection point A of two of these straight lines closer to sidewalls SW1 and SW2 and an intersection point B of two of these straight lines farther from sidewalls SW1 and SW2 is the thickness of gate insulating film 91 at sidewall-connecting corner portion CN1. In the present embodiment, a relation of tb1>ta1 is satisfied since trench TR having a closed shape when seen in plan view is provided. Although the thickness of a portion of gate insulating film 91 in contact with one sidewall SW1 and the thickness of a portion of gate insulating film 91 in contact with the other sidewall SW2 are the same in FIG. 5, these thicknesses may be different from each other. Even if they are different, the thickness of gate insulating film 91 at sidewall-connecting corner portion CN1 is to be defined in a similar manner.

Referring now again to FIG. 1, the remaining configuration of silicon carbide semiconductor device 201 is described. As shown in FIG. 1, gate electrode 92 is provided on gate insulating film 91 within trench TR. Here, an upper end of gate electrode 92 is located below the upper end of trench TR. Accordingly, silicon carbide semiconductor device 201 has a further improved breakdown voltage. The reason for this is that gate electrode 92 is not in contact with gate insulating film 91 located at upper end corner portion CN2 and having a relatively small thickness. This is specifically described below.

Figure 6:
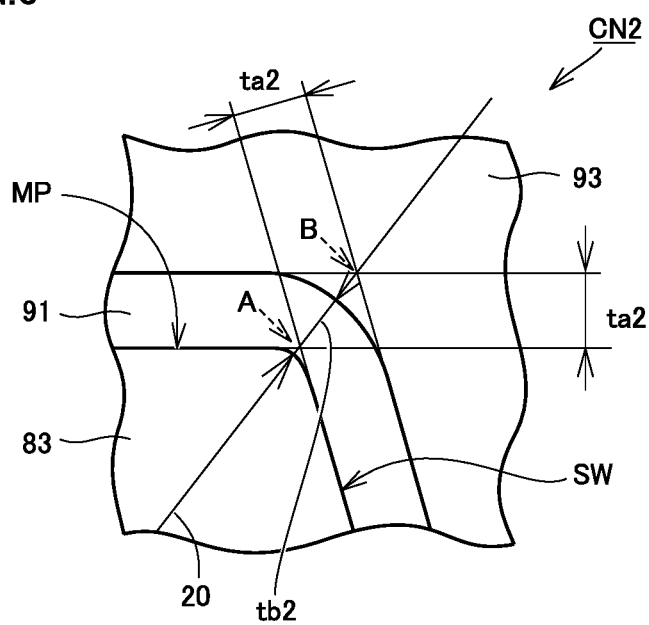
FIG. 6 is a partial enlarged view showing a vicinity of an upper end corner portion according to the one embodiment of the present invention.

FIG. 6 is a partial enlarged view of a connection portion between main surface MP and sidewall SW in FIG. 1. Upper end corner portion CN2 shown in FIG. 6 is formed at the connection portion between main surface MP and sidewall SW. Unlike sidewall-connecting corner portion CN1, upper end corner portion CN2 projects outward from n+ layer 83 (silicon carbide semiconductor layer 100). Thus, the thickness of a portion of gate insulating film 91 covering upper end corner portion CN2 is smaller than the thickness of a portion of gate insulating film 91 covering main surface MP and the thickness of a portion of gate insulating film 91 covering sidewall SW. Accordingly, the breakdown voltage can be improved by providing gate electrode 92 such that gate electrode 92 is not in contact with gate insulating film 91 at upper end corner portion CN2.

Further, in this case, a portion of gate insulating film 91 not in contact with gate electrode 92 does not substantially contribute to the breakdown voltage of the semiconductor device. Accordingly, the thickness of this portion can also be made smaller than the thickness of a portion in contact with gate electrode 92 (typically, the thickness of gate insulating film 91 at the center in a depth direction of trench TR).

It should be noted that "the thickness of a portion in contact with upper end corner portion CN2" is defined as follows. As shown in FIG. 6, gate insulating film 91 has a thickness ta2 at a linearly extending portion thereof. Then, consider two straight lines which are parallel to main surface MP and which sandwich gate insulating film 91 therebetween, and two straight lines which are parallel to sidewall SW and which sandwich gate insulating film 91 therebetween. A thickness tb2 of gate insulating film 91 on a straight line 20 passing through an intersection point A of two of these straight lines closer to main surface MP and sidewall SW and an intersection point B of two of these straight lines farther from main surface MP and sidewall SW is the thickness of gate insulating film 91 at the portion in contact with upper end corner portion CN2. Since upper end corner portion CN2 projects outward from silicon carbide semiconductor layer 100 as described above, a relation of tb2<ta2 is satisfied. Although the thickness of a portion of gate insulating film 91 in contact with main surface MP and the thickness of a portion of gate insulating film 91 in contact with sidewall SW are the same in FIG. 6, these thicknesses may be different from each other. Even if they are different, the thickness of the portion in contact with upper end corner portion CN2 is to be defined in a similar manner.

Referring again to FIG. 1, silicon carbide semiconductor device 201 has, on gate electrode 92, gate wire 96 electrically connected to gate electrode 92. Gate wire 96 is covered with interlayer insulating film 93. In a position adjacent to trench TR, source electrode 94 is provided in contact with each of n+ layer 83 and p contact region 84. Source wire 97 is in contact with interlayer insulating film 93, and electrically connected to source electrode 94. Gate wire 96 and source wire 97 are made of a conductor such as aluminum. Drain electrode 98 is provided in contact with single-crystal substrate 80.

Figure 2:
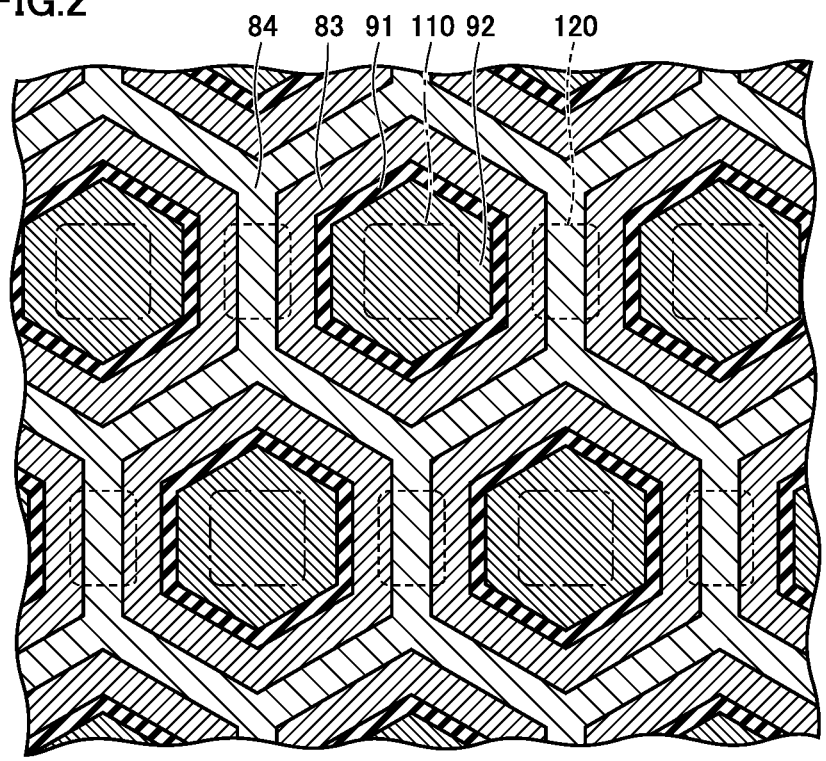
FIG. 2 is a partial plan view showing an exemplary plane along line II-II in FIG. 1.

Here, gate wire 96 and source wire 97 are disposed in a grade separated crossing manner such that they are not in contact with each other. FIG. 2 is a partial cross-sectional view along line II-II in FIG. 1. A region enclosed by a chain-dotted line in FIG. 2 indicates a connection portion 110 between gate wire 96 and gate electrode 92. A region enclosed by a dotted line in FIG. 2 indicates the position of a connection portion 120 between source wire 97 and source electrode 94. Here, gate wire 96 constitutes a mesh-type network by connecting adjacent gate electrodes 92 together while avoiding connection portion 120 between adjacent source wire 97 and source electrode 94. Source wire 97 is then disposed on gate wire 96 with interlayer insulating film 93 interposed between, to cover the entire upper surface of silicon carbide semiconductor device 201. By employing such a configuration, the volume of source wire 97 through which a larger amount of current flows than through gate wire 96 can be increased, thereby contributing to reducing the on-resistance of the semiconductor device.

Figure 7:
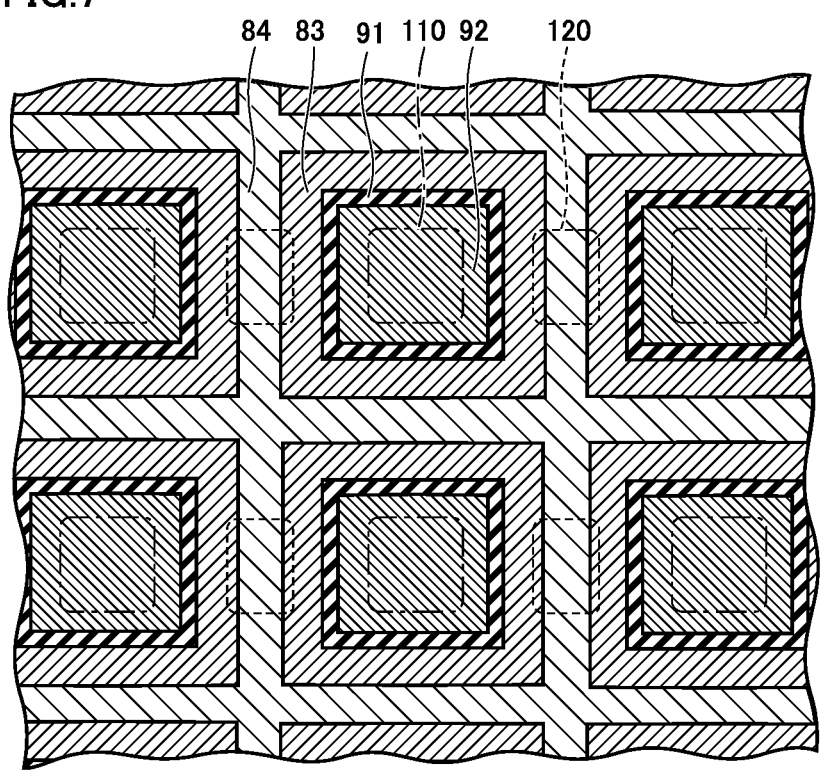
FIG. 7 is a partial plan view showing another exemplary plane along line II-II in FIG. 1.

Although silicon carbide semiconductor device 201 has been described as above, in the present embodiment, "a closed shape when seen in plan view" of trench TR is not limited to a hexagonal shape. In the present embodiment, "a closed shape when seen in plan view" refers to a polygon having three or more sides. Accordingly, for example, "a closed shape when seen in plan view" of trench TR may be a quadrangular shape (rectangle, rhombus, parallelogram, etc.) as shown in FIG. 7. This is because as long as the closed shape when seen in plan view is a polygon having three or more sides, the thickness of gate insulating film 91 at sidewall-connecting corner portion CN1 can be made greater than the thickness of the other portion of gate insulating film 91 in the same plane.

Although FIG. 1 and the like illustrate the embodiment in which bottom BT of trench TR is a surface substantially parallel to main surface MP, the cross-sectional shape of trench TR in cross section perpendicular to main surface MP is not limited to this embodiment, but may be a V-shape or U-shape. In addition, the conductivity types of the layers or regions of silicon carbide semiconductor device 201 may be of different polarities than those described above.

<Method of Manufacturing Silicon Carbide Semiconductor Device>

Figure 20:
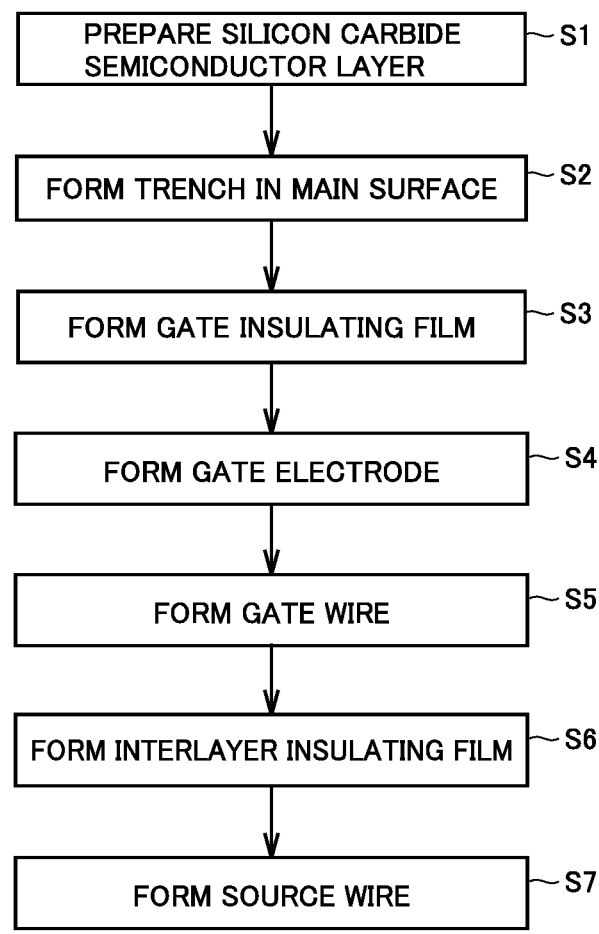
FIG. 20 is a flowchart showing an outline of a method of manufacturing the silicon carbide semiconductor device according to the one embodiment of the present invention.

The silicon carbide semiconductor device of the present embodiment as described above can be manufactured with the following manufacturing method. FIG. 20 is a flowchart showing an outline of the method of manufacturing the silicon carbide semiconductor device according to the present embodiment. As shown in FIG. 20, the method of manufacturing the silicon carbide semiconductor device according to the present embodiment includes a step S1, a step S2, a step S3 and a step S4, and can further include a step S5, a step S6 and a step S7. The steps are described below.

<Step S1>

Figure 8:
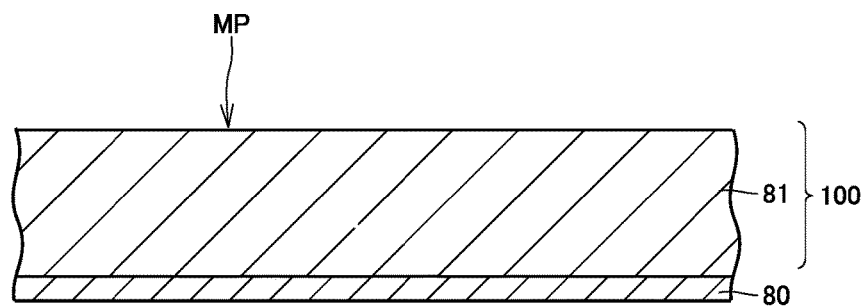
FIG. 8 is a partial cross-sectional view schematically showing part of a process of manufacturing the silicon carbide semiconductor device according to the one embodiment of the present invention.

In step S1, silicon carbide semiconductor layer 100 having main surface MP is prepared. Referring to FIG. 8, silicon carbide semiconductor layer 100 is formed on single-crystal substrate 80 by epitaxial growth. Here, single-crystal substrate 80 can be obtained, for example, by slicing an ingot (not shown) made of hexagonal silicon carbide having a polytype of 4H. The epitaxial growth of silicon carbide semiconductor layer 100 can be performed by a CVD (Chemical Vapor Deposition) process using a mixed gas of silane ($SiH_4$) and propane ($C_3H_8$) as a material gas, for example, and using hydrogen gas ($H_2$) as a carrier gas, for example. In doing so, it is preferable to introduce nitrogen (N) or phosphorus (P), for example, as an impurity. Accordingly, n drift layer 81 is formed in silicon carbide semiconductor layer 100.

Figure 9:
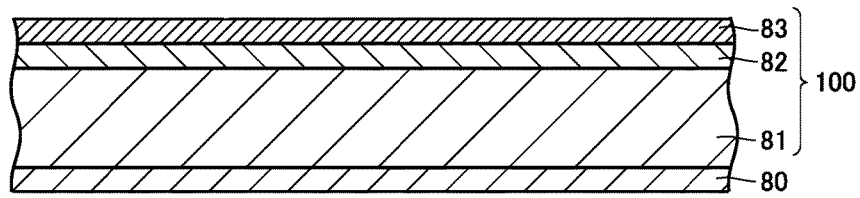
FIG. 9 is a partial cross-sectional view schematically showing part of the process of manufacturing the silicon carbide semiconductor device according to the one embodiment of the present invention.

Next, as shown in FIG. 9, p body layer 82 and n+ layer 83 are formed on n drift layer 81. They can be formed by, for example, ion implantation into the entire surface of n drift layer 81. In the ion implantation for forming p body layer 82, ions of an impurity for providing p type conductivity such as aluminum (Al) are implanted. Meanwhile, in the ion implantation for forming n+ layer 83, ions of an impurity for providing n type conductivity such as phosphorus (P) are implanted. It should be noted that instead of the ion implantation, epitaxial growth involving the addition of impurities may be performed.

Figure 10:
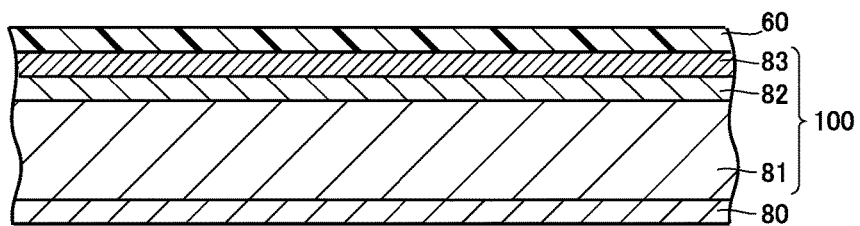
FIG. 10 is a partial cross-sectional view schematically showing part of the process of manufacturing the silicon carbide semiconductor device according to the one embodiment of the present invention.
Figure 11:
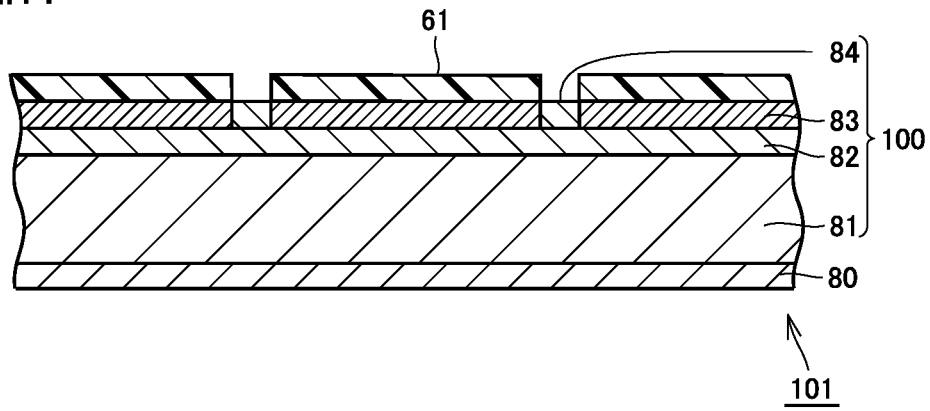
FIG. 11 is a partial cross-sectional view schematically showing part of the process of manufacturing the silicon carbide semiconductor device according to the one embodiment of the present invention.
Figure 12:
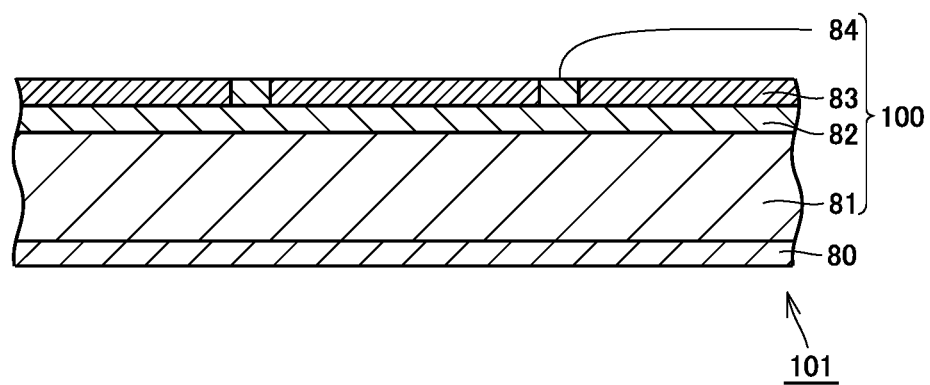
FIG. 12 is a partial cross-sectional view schematically showing part of the process of manufacturing the silicon carbide semiconductor device according to the one embodiment of the present invention.

Next, as shown in FIG. 10, a resist film 60 is formed on n+ layer 83. Then, as shown in FIG. 11, resist film 60 is exposed and developed. Accordingly, a mask layer 61 is formed which has an opening corresponding to the location where p contact region 84 is to be formed. Next, ion implantation is performed through mask layer 61 so as to form p contact region 84. Mask layer 61 is then removed as shown in FIG. 12.

Next, heat treatment is performed to activate the impurities. The heat treatment on this occasion is preferably performed at a temperature of not less than 1500° C. and not more than 1900° C., such as about 1700° C. The heat treatment can be performed for about 30 minutes, for example. The atmosphere of the heat treatment is preferably an inert gas atmosphere, such as an argon (Ar) atmosphere. Silicon carbide semiconductor layer 100 is thus prepared.

<Step S2>

Next, step S2 of forming trench TR having a closed shape when seen in plan view in main surface MP of silicon carbide semiconductor layer 100 is performed.

Figure 13:
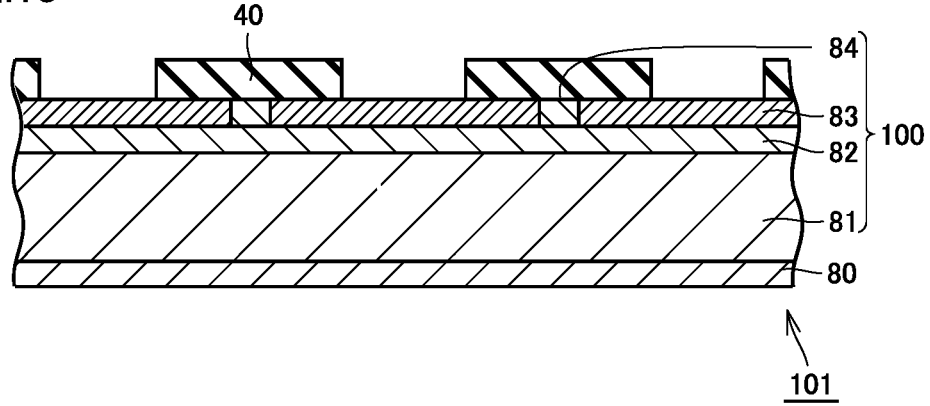
FIG. 13 is a partial cross-sectional view schematically showing part of the process of manufacturing the silicon carbide semiconductor device according to the one embodiment of the present invention.

First, as shown in FIG. 13, a mask layer 40 having an opening is formed on main surface MP by photolithography. This mask layer 40 has a closed shape when seen in plan view (not shown). As mask layer 40, a silicon oxide ($SiO_2$) film or the like can be used, for example. The opening is formed to correspond to the position of trench TR.

Figure 14:
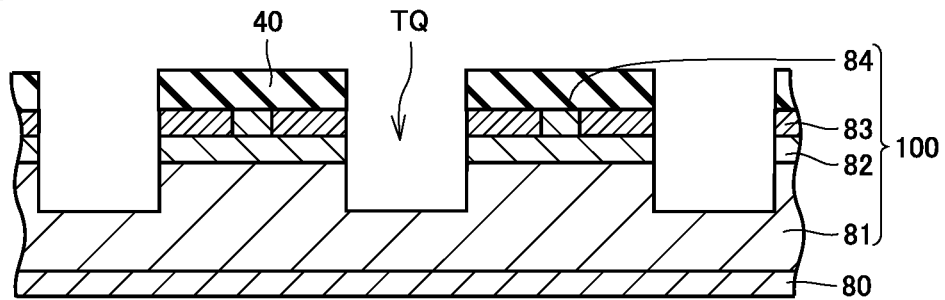
FIG. 14 is a partial cross-sectional view schematically showing part of the process of manufacturing the silicon carbide semiconductor device according to the one embodiment of the present invention.

Next, as shown in FIG. 14, n+ layer 83, p body layer 82, and a portion of n drift layer 81 are removed by etching in the opening in mask layer 40. An exemplary, usable etching method is reactive ion etching (RIE), in particular, inductively coupled plasma (ICP)-RIE. Specifically, ICP-RIE can be used which employs $SF_6$ or a mixed gas of $SF_6$ and $O_2$ as a reactive gas, for example. As a result of this etching, a trench TQ having sidewalls substantially perpendicular to main surface MP is formed in a region where trench TR is to be formed. It should be noted that this trench TQ also has a closed shape when seen in plan view (not shown).

Figure 15:
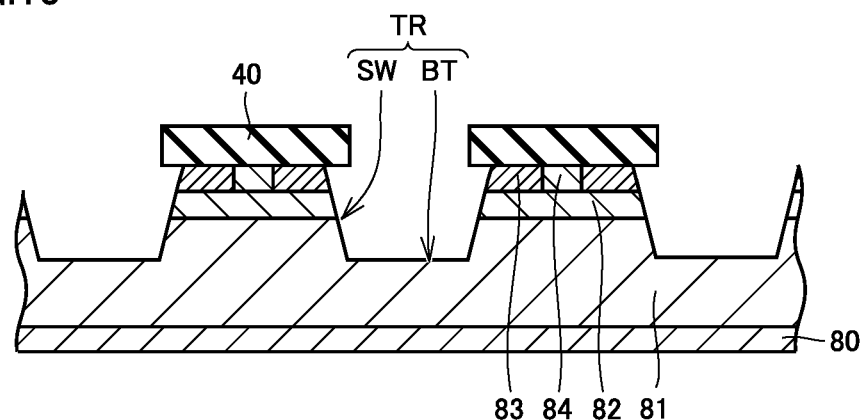
FIG. 15 is a partial cross-sectional view schematically showing part of the process of manufacturing the silicon carbide semiconductor device according to the one embodiment of the present invention.

Next, referring to FIG. 15, thermal etching is performed in trench TQ. The thermal etching can be performed by, for example, heating in an atmosphere including a reactive gas having at least one or more types of halogen atom. In this thermal etching, the at least one or more types of halogen atom include at least one of chlorine (Cl) atom and fluorine (F) atom. This atmosphere is, for example, $Cl_2$, $BCl_3$, $SF_6$, or $CF_4$. The thermal etching is performed using a mixed gas of chlorine gas and oxygen gas as a reactive gas, for example, at a heat treatment temperature of not less than 700° C. and not more than 1000° C., for example.

The reactive gas may contain a carrier gas in addition to the aforementioned chlorine gas and oxygen gas. An exemplary, usable carrier gas is nitrogen ($N_2$) gas, argon (Ar) gas, helium (He) gas, or the like. When the heat treatment temperature is set at not less than 700° C. and not more than 1000° C. as described above, a rate of etching silicon carbide (SiC) is, for example, about 70 μm/hr. Further, in this case, mask layer 40 made of silicon oxide ($SiO_2$) is not substantially etched during etching of SiC because a selection ratio to SiC is extremely large.

As a result of the thermal etching described above, trench TR is formed to have bottom BT and the plurality of sidewalls SW continuous with bottom BT. That is, trench TR is formed to have a closed shape when seen in plan view. Then, sidewall-connecting corner portion CN1 is formed at a connection portion between two adjacent sidewalls SW. Thereafter, mask layer 40 is removed with an appropriate method such as etching. It should be noted that the closed shape when seen in plan view of trench TR in the present embodiment is preferably a hexagonal shape or quadrangular shape so as to facilitate a finer structure of the semiconductor device.

<Step S3>

Figure 16:
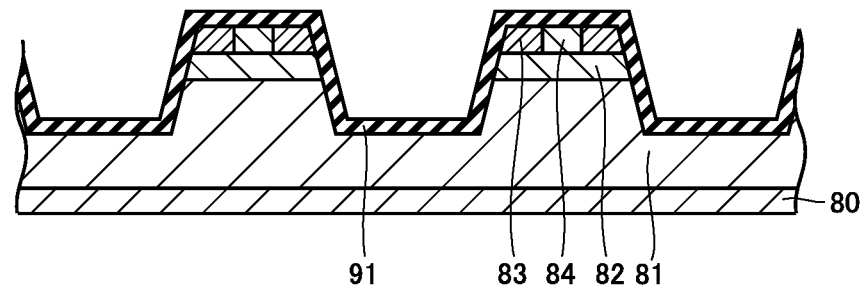
FIG. 16 is a partial cross-sectional view schematically showing part of the process of manufacturing the silicon carbide semiconductor device according to the one embodiment of the present invention.

Next, referring to FIG. 16, step S3 of forming gate insulating film 91 covering bottom BT and sidewalls SW of trench TR is performed. Gate insulating film 91 is preferably formed by thermal oxidation. In the present embodiment, trench TR has a closed shape when seen in plan view. In the present embodiment, therefore, between bottom BT and the upper end of trench TR, in the plane intersecting with sidewalls SW in the direction along main surface MP, the thickness of gate insulating film 91 at sidewall-connecting corner portion CN1 of trench TR is formed to be greater than the thickness gate insulating film 91 at a portion other than sidewall-connecting corner portion CN1.

If gate insulating film 91 is formed by thermal oxidation, silicon carbide semiconductor layer 100 is preferably subjected to heat treatment at a temperature of not less than 1250° C. in an atmosphere including oxygen. The reason for this is described with reference to Table 1.

TABLE 1

| | Temperature during thermal oxidation | | | | |
|---|---|---|---|---|---|
| | 1200° C. | 1250° C. | 1300° C. | 1350° C. | 1400° C. |
| (1) Thickness of gate insulating film at bottom BT (Å) | 146 | 270 | 449 | 659 | 883 |
| (2) Thickness of gate insulating film at sidewalls SW (Å) | 311 | 447 | 581 | 782 | 970 |
| Thickness ratio ((1) ÷ (2)) | 0.47 | 0.60 | 0.77 | 0.84 | 0.91 |

Table 1 shows results of evaluating the thickness of gate insulating film 91 formed with varying temperature during the thermal oxidation in the method of manufacturing the silicon carbide semiconductor device of the present embodiment. The thickness evaluation was made for each of bottom BT and sidewalls SW. As shown in Table 1, when the thermal oxidation is performed at 1200° C., the thickness of gate insulating film 91 at bottom BT is 146 Å, and the thickness of gate insulating film 91 at sidewalls SW is 311 Å. In this case, a value obtained by dividing the thickness of gate insulating film 91 at bottom BT by the thickness of the gate insulating film at sidewalls SW (thickness ratio) is 0.47. As such, at 1200° C., a portion of gate insulating film 91 covering bottom BT has a thickness greater than or equal to half the thickness of a portion of gate insulating film 91 covering sidewalls SW. When the heat treatment temperature reaches 1250° C., however, the thickness ratio is 0.60, with a smaller difference in thickness. As the temperature increases to 1300° C., 1350° C. and 1450° C., the difference is thickness shows a tendency to decrease further. Accordingly, with the thermal oxidation temperature being not less than 1250° C., gate insulating film 91 tends to be formed uniformly within trench TR, which improves the breakdown voltage. The thermal oxidation temperature is more preferably not less than 1300° C., further preferably not less than 1350° C., and particularly preferably not less than 1400° C.

Conventionally, when thermal oxidation is performed at such high temperature, $SiO_2$ has softened and flowed at a corner portion projecting outward from a semiconductor substrate, resulting in the generation of a locally thin portion of a gate insulating film. In contrast, in the present embodiment, since trench TR having a closed shape when seen in plan view is formed, even if $SiO_2$ flows under high temperature, $SiO_2$ flows to collect at sidewall-connecting corner portion CN1, thus not resulting in the generation of a locally thin portion of gate insulating film 91. According to the method of manufacturing the silicon carbide semiconductor device of the present embodiment, therefore, the silicon carbide semiconductor device having a high breakdown voltage can be manufactured by performing the thermal oxidation at a temperature of not less than 1250° C.

It should be noted that the higher the temperature in the thermal oxidation, the greater the thickness of gate insulating film 91 can be at sidewall-connecting corner portion CN1, and the smaller the thickness of gate insulating film 91 can be at upper end corner portion CN2. That is, by adjusting the thermal oxidation temperature, the thickness of the portion of gate insulating film 91 in contact with upper end corner portion CN2 can be made smaller than the thickness of gate insulating film 91 at the center in the depth direction of trench TR.

After the formation of gate insulating film 91, NO annealing using nitrogen monoxide (NO) gas as an atmospheric gas may be performed. As annealing conditions, for example, the temperature can be set at not less than 1100° C. and not more than 1300° C. and a holding time can be set at about 1 hour. Accordingly, nitrogen atoms are introduced into an interface region between gate insulating film 91 and p body layer 82. As a result, the formation of an interface state in the interface region can be suppressed, thereby improving channel mobility. It should be noted that gas other than the NO gas can be used as the atmospheric gas as long as such introduction of nitrogen atoms is possible.

Moreover, Ar annealing using argon (Ar) as an atmospheric gas may be performed after the NO annealing. The Ar annealing is preferably performed at a heating temperature that is higher than the heating temperature in the above-described NO annealing and that is lower than the melting point of gate insulating film 91. A holding time of the Ar annealing is about 1 hour, for example. Accordingly, the formation of an interface state in the interface region between gate insulating film 91 and p body layer 82 can be further suppressed. It should be noted that as the atmospheric gas, other inert gases such as nitrogen gas may be used instead of the Ar gas.

<Step S4>

Figure 17:
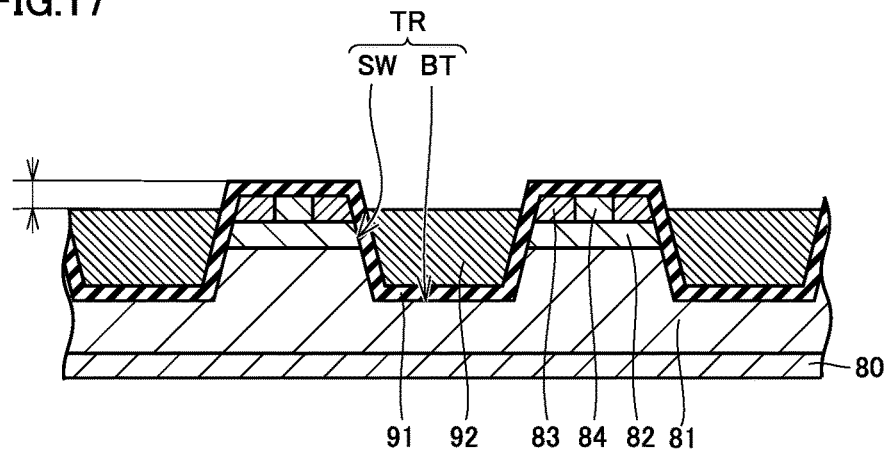
FIG. 17 is a partial cross-sectional view schematically showing part of the process of manufacturing the silicon carbide semiconductor device according to the one embodiment of the present invention.

After the formation of gate insulating film 91 in step S3, referring to FIG. 17, step S4 of forming gate electrode 92 on gate insulating film 91 is performed. Specifically, gate electrode 92 is formed on gate insulating film 91 so as to fill the region within trench TR with gate insulating film 91 interposed therebetween. Gate electrode 92 can be formed by, for example, forming a film of a conductor or doped polysilicon and performing CMP (Chemical Mechanical Polishing).

Here, as shown in FIG. 17, it is preferable to form gate electrode 92 such that the upper end of gate electrode 92 is located below the upper end of trench TR. As has been discussed, the thickness of the portion of gate insulating film 91 in contact with upper end corner portion CN2 may be formed to be thin. Thus, by positioning the upper end of gate electrode 92 below the upper end of trench TR, gate electrode 92 is prevented from contacting the thin portion of gate insulating film 91, thereby attaining a high breakdown voltage.

<Step S5>

Figure 18:
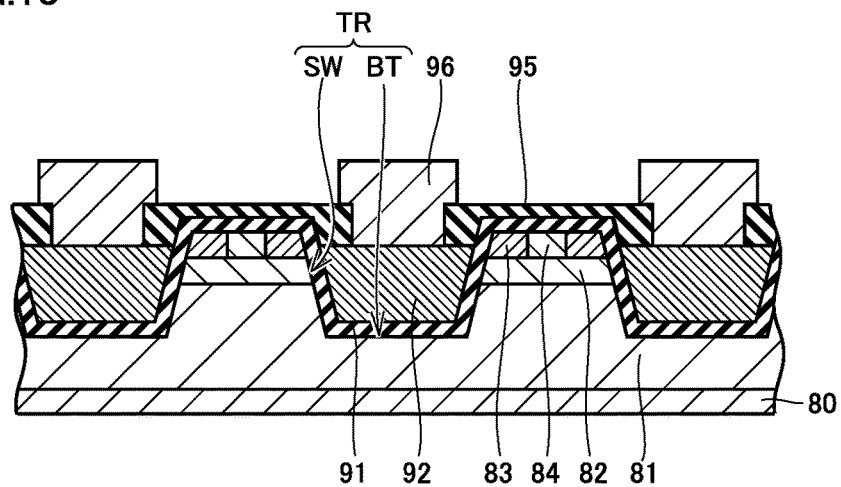
FIG. 18 is a partial cross-sectional view schematically showing part of the process of manufacturing the silicon carbide semiconductor device according to the one embodiment of the present invention.

After the formation of gate electrode 92, referring to FIG. 18, step S5 of forming gate wire 96 is performed. First, an insulating film 95 made of silicon oxide or the like and having an opening in a region where gate wire 96 is to be formed is formed by a CVD process, for example. Then, a resist layer having an opening pattern to become gate wire 96 is formed, Al is vapor deposited, and then the Al on the resist layer is removed together with the resist layer (liftoff), thereby forming gate wire 96. It should be noted that insulating film 95 becomes a portion of interlayer insulating film 93 to be described later.

<Step S6>

Figure 19:
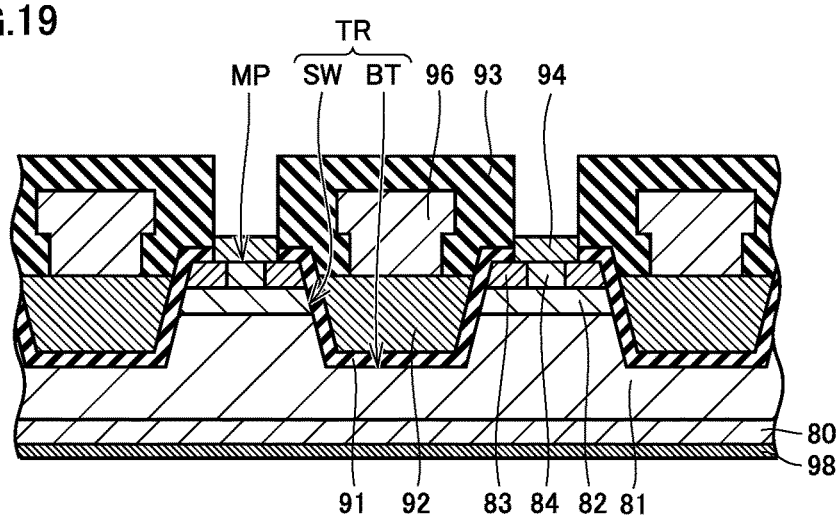
FIG. 19 is a partial cross-sectional view schematically showing part of the process of manufacturing the silicon carbide semiconductor device according to the one embodiment of the present invention.

Next, referring to FIG. 19, step S6 of forming interlayer insulating film 93 covering gate wire 96 is performed. Then, etching is performed to form an opening in interlayer insulating film 93 and gate insulating film 91. Each of n+ layer 83 and p contact region 84 is exposed at main surface MP through this opening. Then, source electrode 94 is formed in contact with each of n+ layer 83 and p contact region 84 on main surface MP. Further, in single-crystal substrate 80, drain electrode 98 is formed on a backside surface opposite to the main surface side on which n drift layer 81 has been formed.

<Step S7>

Referring again to FIG. 1, step S7 of forming source wire 97 electrically connected to source electrode 94 on interlayer insulating film 93 is performed.

In this manner, the silicon carbide semiconductor device of the present embodiment having a high breakdown voltage can be manufactured.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 10, 20 straight line; 40, 61 mask layer; 60 resist film; 80 single-crystal substrate; 81 n drift layer; 82 p body layer; 83 n+ layer; 84 p contact region; 91 gate insulating film; 92 gate electrode; 93 interlayer insulating film; 94 source electrode; 95 insulating film; 96 gate wire; 97 source wire; 98 drain electrode; 100 silicon carbide semiconductor layer; 110, 120 connection portion; 201 silicon carbide semiconductor device; A, B intersection point; TR, TQ trench; SW, SW1, SW2 sidewall; BT bottom; CN1 sidewall-connecting corner portion; CN2 upper end corner portion.

The invention claimed is:

1. A silicon carbide semiconductor device, comprising a silicon carbide semiconductor layer having a main surface,
  the main surface of the silicon carbide semiconductor layer being provided with a trench having a closed shape when seen in plan view,
  the trench including a bottom, a plurality of sidewalls continuous with the bottom, and a sidewall-connecting corner portion at a connection portion between two adjacent sidewalls of the plurality of sidewalls,
  the silicon carbide semiconductor device further comprising:
    a gate insulating film covering the bottom and the sidewalls of the trench; and
    a gate electrode provided on the gate insulating film,
  the gate insulating film surrounding the gate electrode when seen in plan view, and
  between the bottom and an upper end of the trench, the thickness of the gate insulating film at the sidewall-connecting corner portion of the trench being greater than the thickness of the gate insulating film at a portion other than the sidewall-connecting corner portion.

2. The silicon carbide semiconductor device according to claim 1, wherein
  an upper end of the gate electrode is located below the upper end of the trench.

3. The silicon carbide semiconductor device according to claim 1, wherein
  the gate insulating film extends to cover an upper end corner portion which is a connection portion between the upper end of the trench and the main surface, and the thickness of a portion of the gate insulating film in contact with the upper end corner portion is smaller than the thickness of the gate insulating film at the center in a depth direction of the trench.

4. The silicon carbide semiconductor device according to claim 1, wherein
  the closed shape when seen in plan view of the trench is a hexagonal shape or quadrangular shape.

5. The silicon carbide semiconductor device according to claim 1, comprising:
  a gate wire electrically connected to the gate electrode;
  an interlayer insulating film covering the gate wire;
  a source region formed in a position adjacent to the trench in the silicon carbide semiconductor layer; and
  a source wire provided on the interlayer insulating film and electrically connected to the source region.

6. A method of manufacturing a silicon carbide semiconductor device, comprising the steps of:
  preparing a silicon carbide semiconductor layer having a main surface; and
  forming a trench having a closed shape when seen in plan view in the main surface of the silicon carbide semiconductor layer,
  the trench including a bottom, a plurality of sidewalls continuous with the bottom, and a sidewall-connecting corner portion at a connection portion between two adjacent sidewalls of the plurality of sidewalls,
  the method further comprising the steps of
    forming a gate insulating film covering the bottom and the sidewalls of the trench, and
    forming a gate electrode on the gate insulating film,
  the gate insulating film surrounding the gate electrode when seen in plan view, and
  between the bottom and an upper end of the trench, the thickness of the gate insulating film at the sidewall-connecting corner portion of the trench being formed to be greater than the thickness of the gate insulating film at a portion other than the sidewall-connecting corner portion.

7. The method of manufacturing a silicon carbide semiconductor device according to claim 6, wherein an upper end of the gate electrode is formed to be located below the upper end of the trench.

8. The method of manufacturing a silicon carbide semiconductor device according to claim 6, wherein the gate insulating film extends to cover an upper end corner portion which is a connection portion between the upper end of the trench and the main surface, and the thickness of a portion of the gate insulating film in contact with the upper end corner portion is formed to be smaller than the thickness of the gate insulating film at the center in a depth direction of the trench.

9. The method of manufacturing a silicon carbide semiconductor device according to claim 6, wherein the closed shape when seen in plan view of the trench is formed as a hexagonal shape or quadrangular shape.

10. The method of manufacturing a silicon carbide semiconductor device according to claim 6, comprising the steps of:

forming a gate wire electrically connected to the gate electrode; and forming an interlayer insulating film covering the gate wire, wherein the silicon carbide semiconductor layer has a source region formed in a position adjacent to the trench, and the method comprises the step of forming a source wire provided on the interlayer insulating film and electrically connected to the source region.

11. The method of manufacturing a silicon carbide semiconductor device according to claim 6, wherein in the step of forming a gate insulating film, the gate insulating film is formed by subjecting the silicon carbide semiconductor layer to heat treatment at a temperature of not less than 1250° C. in an atmosphere including oxygen.

\* \* \* \* \*